(12) United States Patent
Baik

(10) Patent No.: US 12,362,318 B2
(45) Date of Patent: Jul. 15, 2025

(54) SEMICONDUCTOR PACKAGE COMPRISING SEMICONDUCTOR CHIP WITH STEPPED PORTION

(71) Applicant: Samsung Electronics Co., Ltd., Suwon-si (KR)

(72) Inventor: Seunghyun Baik, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/747,429

(22) Filed: May 18, 2022

(65) Prior Publication Data

US 2023/0087607 A1 Mar. 23, 2023

(30) Foreign Application Priority Data

Sep. 14, 2021 (KR) ........................ 10-2021-0122715

(51) Int. Cl.
*H01L 25/065* (2023.01)
*H01L 23/00* (2006.01)

(52) U.S. Cl.
CPC .......... *H01L 25/0652* (2013.01); *H01L 24/32* (2013.01); *H01L 24/33* (2013.01); *H01L 24/48* (2013.01); *H01L 24/49* (2013.01); *H01L 24/73* (2013.01); *H01L 24/16* (2013.01); *H01L 2224/16227* (2013.01); *H01L 2224/16237* (2013.01); *H01L 2224/3201* (2013.01); *H01L 2224/32145* (2013.01); *H01L 2224/32225* (2013.01); *H01L 2224/3303* (2013.01); *H01L 2224/33181* (2013.01); *H01L 2224/48011* (2013.01); *H01L 2224/48091* (2013.01); *H01L 2224/48148* (2013.01); *H01L 2224/48228* (2013.01); *H01L 2224/4903* (2013.01); *H01L 2224/49052* (2013.01); *H01L 2224/49112* (2013.01); *H01L 2224/73204* (2013.01); *H01L 2224/73215* (2013.01); *H01L 2224/73253* (2013.01); *H01L 2224/73265* (2013.01); *H01L 2225/06506* (2013.01); *H01L 2225/0651* (2013.01); *H01L 2225/06517* (2013.01); *H01L 2225/06524* (2013.01);
(Continued)

(58) Field of Classification Search
None
See application file for complete search history.

(56) References Cited

U.S. PATENT DOCUMENTS

| | | | |
|---|---|---|---|
| 7,977,802 B2 * | 7/2011 | Pagaila | H01L 25/03 257/784 |
| 8,674,494 B2 | 3/2014 | Nam et al. | |

(Continued)

*Primary Examiner* — Nduka E Ojeh
(74) *Attorney, Agent, or Firm* — Muir Patent Law, PLLC

(57) ABSTRACT

A semiconductor package includes a substrate extending in a first direction and a second direction perpendicular to the first direction, a first semiconductor chip disposed on the substrate, the first semiconductor chip having a stepped portion, a second semiconductor chip disposed on the substrate and horizontally spaced apart from the first semiconductor chip in the first direction, a third semiconductor chip disposed on the second semiconductor chip and a bottom surface of the stepped portion, and an upper adhesive layer disposed between the second semiconductor chip and the third semiconductor chip, the upper adhesive layer contacting a portion of the bottom surface of the stepped portion.

19 Claims, 16 Drawing Sheets

(52) U.S. Cl.
CPC ............... *H01L 2225/06562* (2013.01); *H01L 2924/1011* (2013.01); *H01L 2924/1431* (2013.01); *H01L 2924/1436* (2013.01); *H01L 2924/15311* (2013.01); *H01L 2924/35121* (2013.01)

(56) References Cited

U.S. PATENT DOCUMENTS

| | | |
|---|---|---|
| 8,952,533 B2 | 2/2015 | Mohammed et al. |
| 10,262,972 B2 * | 4/2019 | Lee ................... H01L 25/0652 |
| 10,381,334 B2 | 8/2019 | Kang et al. |
| 10,748,854 B2 | 8/2020 | Cheah et al. |
| 10,748,873 B2 | 8/2020 | Guo et al. |
| 10,784,244 B2 | 9/2020 | Han et al. |
| 10,971,479 B2 | 4/2021 | Lee |
| 2010/0225007 A1 * | 9/2010 | Pagaila ................... H01L 24/73 |
| | | 257/E21.705 |
| 2016/0111406 A1 | 4/2016 | Mak |
| 2019/0221542 A1 * | 7/2019 | Cho ................... H01L 25/0652 |
| 2021/0050328 A1 * | 2/2021 | Lee ................... H01L 25/0657 |
| 2022/0285320 A1 * | 9/2022 | Sano ....................... H01L 24/19 |

* cited by examiner

SEMICONDUCTOR PACKAGE COMPRISING SEMICONDUCTOR CHIP WITH STEPPED PORTION

CROSS-REFERENCE TO RELATED APPLICATIONS

This U.S. non-provisional patent application claims priority under 35 U.S.C. § 119 to Korean Patent Application No. 10-2021-0122715, filed on Sep. 14, 2021, in the Korean Intellectual Property Office, the entire contents of which are hereby incorporated by reference.

TECHNICAL FIELD

The present disclosure relates to a semiconductor package and, more particularly, to a semiconductor package including stacked semiconductor chips.

DISCUSSION OF RELATED ART

An integrated circuit chip may be realized in the form of semiconductor packages so as to be appropriately applied to an electronic product. In a typical semiconductor package, a semiconductor chip may be mounted on a printed circuit board (PCB) and may be electrically connected to the printed circuit board (PCB) through bonding wires or bumps. As the electronic industry has been developed, semiconductor packages have been variously developed to realize small sizes, light weights and/or low manufacturing costs. In addition, various kinds of semiconductor packages have been suggested to provide large-capacity storage devices.

SUMMARY

Embodiments of the present inventive concepts may provide a semiconductor package with improved structural stability and reliability.

According to some embodiments of the present inventive concepts, a semiconductor package may include a substrate extending in a first direction and a second direction perpendicular to the first direction, a first semiconductor chip disposed on the substrate, the first semiconductor chip having a stepped portion, a second semiconductor chip disposed on the substrate and horizontally spaced apart from the first semiconductor chip in the first direction, a third semiconductor chip disposed on the second semiconductor chip and a bottom surface of the stepped portion, and an upper adhesive layer disposed between the second semiconductor chip and the third semiconductor chip, the upper adhesive layer contacting a portion of the bottom surface of the stepped portion.

According to some embodiments of the present inventive concepts, a semiconductor package may include a substrate extending in a first direction and a second direction perpendicular to the first direction, a first semiconductor chip disposed on the substrate, the first semiconductor chip having a stepped portion, a lower chip stack disposed on the substrate and horizontally spaced apart from the first semiconductor chip in the first direction, the lower chip stack comprising a plurality of second semiconductor chips stacked in a third direction perpendicular to the first direction and the second direction, a third semiconductor chip disposed on the lower chip stack and a bottom surface of the stepped portion, the third semiconductor chip overlapping with a portion of the first semiconductor chip in the third direction, and an upper connecting portion electrically connecting the substrate to the third semiconductor chip. The upper connecting portion may include a bonding wire.

According to some embodiments of the present inventive concepts, a semiconductor package may include a substrate extending in a first direction and a second direction perpendicular to the first direction, a first semiconductor chip disposed on the substrate, the first semiconductor chip having a stepped portion, a lower chip stack disposed on the substrate and horizontally spaced apart from the first semiconductor chip in the first direction, the lower chip stack comprising a plurality of second semiconductor chips stacked in a third direction perpendicular to the first direction and the second direction, an upper chip stack disposed on the lower chip stack, the upper chip stack comprising a plurality of third semiconductor chips stacked in a cascade shape in the third direction, an upper connecting portion electrically connecting the substrate to the upper chip stack, the upper connecting portion including a bonding wire, a lower connecting portion electrically connecting the substrate to the lower chip stack, and a molding layer covering the first semiconductor chip and the upper chip stack on the substrate.

DETAILED DESCRIPTION

Example embodiments of the present inventive concepts will now be described more fully with reference to the accompanying drawings.

Figure 1:
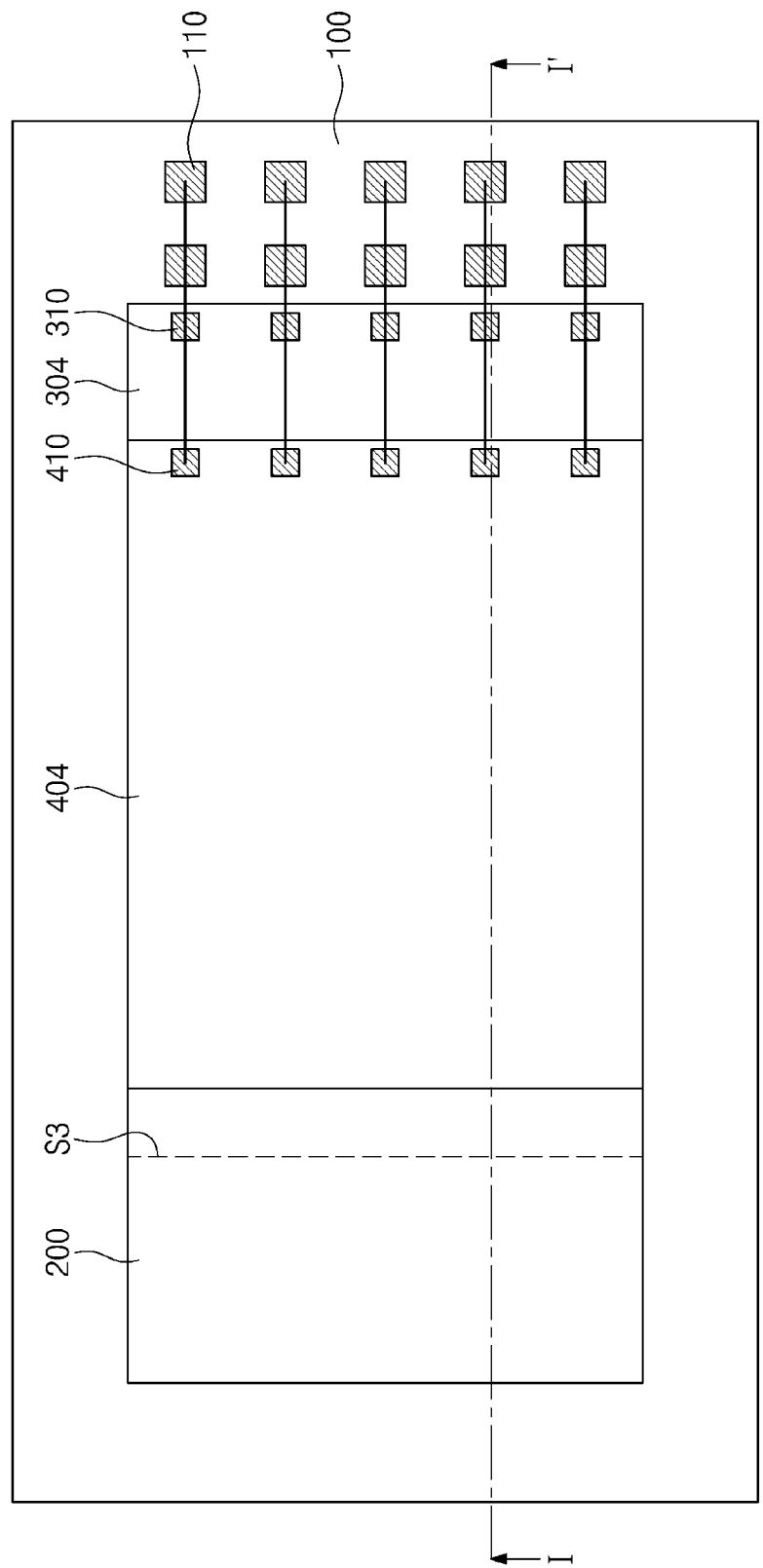
FIG. 1 is a plan view illustrating a semiconductor package according to some embodiments of the present inventive concepts.
Figure 2:
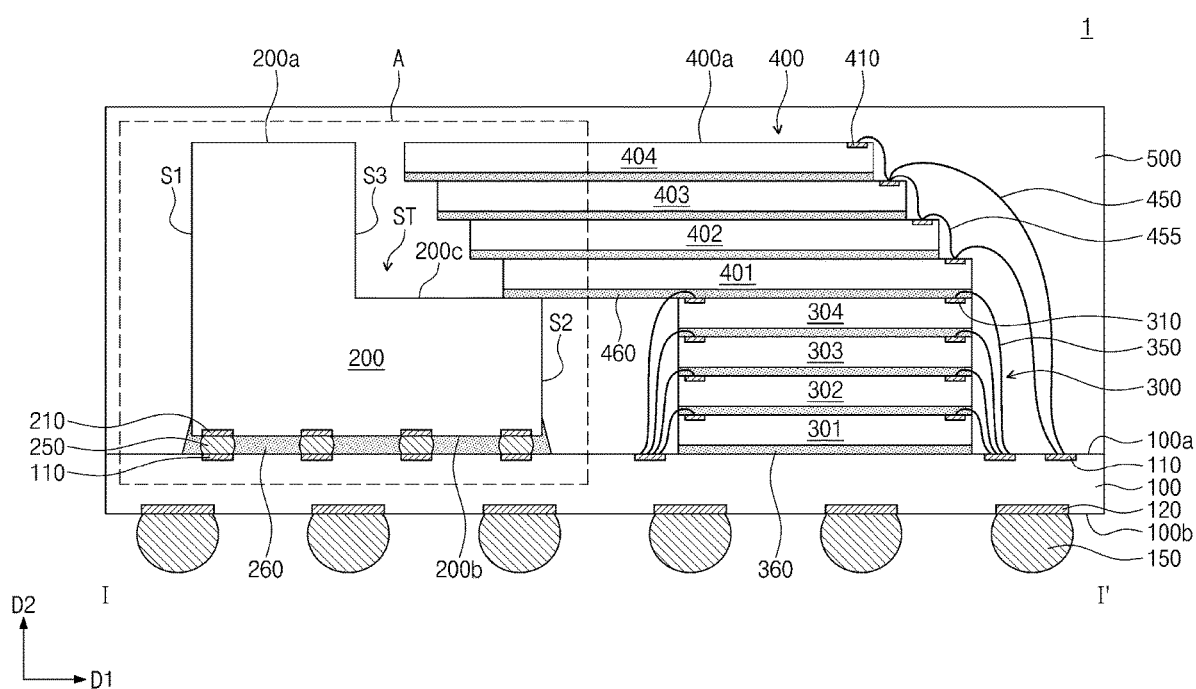
FIG. 2 is a cross-sectional view taken along a line I-I' of FIG. 1 to illustrate a semiconductor package according to some embodiments of the present inventive concepts.
Figure 3:
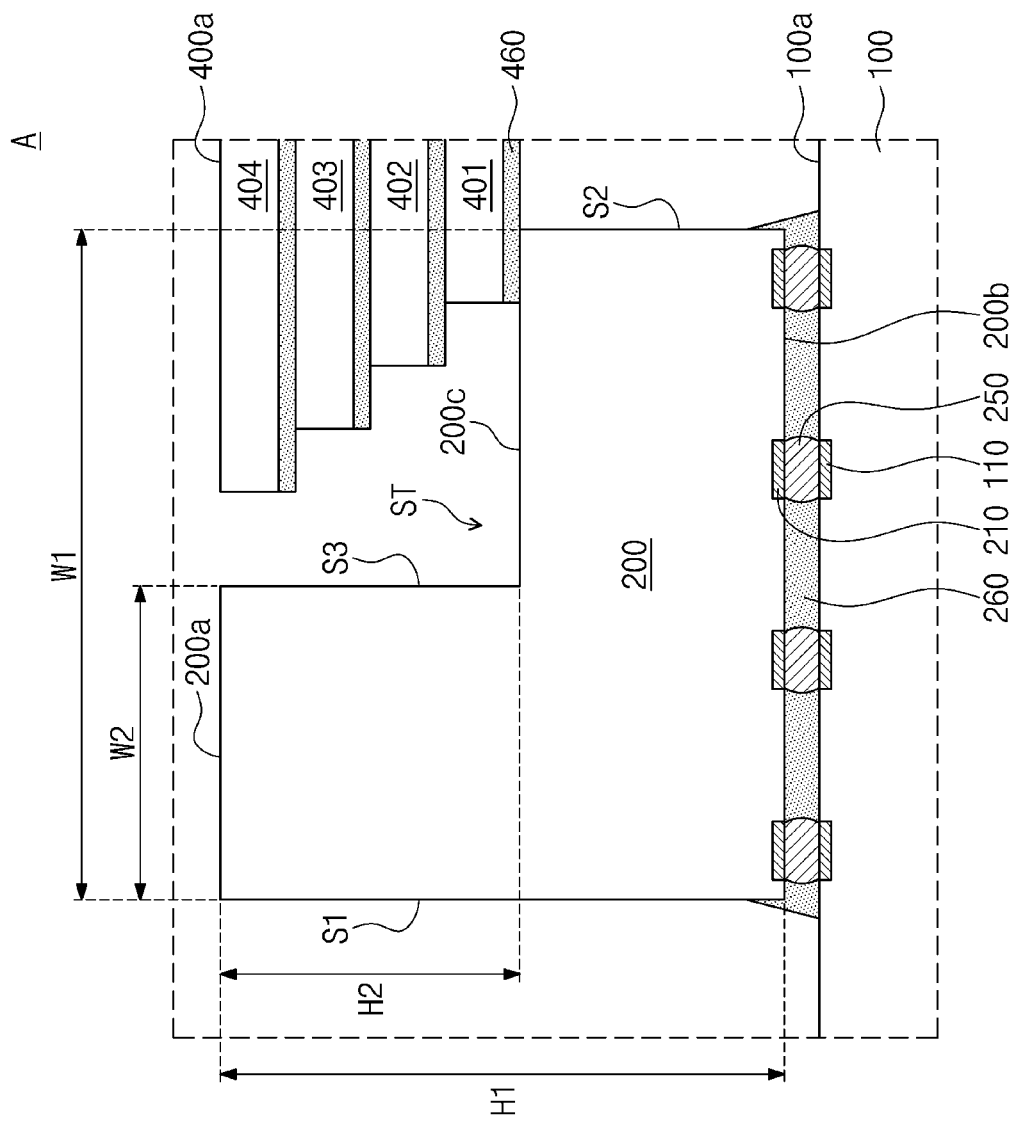
FIG. 3 is an enlarged view of a portion 'A' of FIG. 2.

FIG. 1 is a plan view illustrating a semiconductor package according to some embodiments of the present inventive concepts. FIG. 2 is a cross-sectional view taken along a line I-I' of FIG. 1 to illustrate a semiconductor package according to some embodiments of the present inventive concepts. FIG. 3 is an enlarged view of a portion 'A' of FIG. 2.

Referring to FIGS. 1, 2 and 3, a semiconductor package 1 may include a substrate 100, a first semiconductor chip 200, a lower chip stack 300, and an upper chip stack 400. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For example, the substrate 100 may be a printed circuit board (PCB). The substrate 100 may include a substrate pad 110 and a terminal pad 120. The substrate pad 110 may be disposed adjacent to a top surface 100a of the substrate 100 and may be exposed at the top surface 100a of the substrate 100. The terminal pad 120 may be disposed adjacent to a bottom surface 100b of the substrate 100 and may be exposed at the bottom surface 100b of the substrate 100. Each of the substrate pad 110 and the terminal pad 120 may be provided in plurality. The substrate pads 110 and the terminal pads 120 may include a conductive metal material and may include or may be formed of at least one of, for example, copper (Cu), aluminum (Al), tungsten (W), or titanium (Ti).

An external terminal 150 may be provided on the bottom surface 100b of the substrate 100. The external terminal 150 may be disposed on a bottom surface of the terminal pad 120. The external terminal 150 may include a solder ball or a solder bump. The external terminal 150 may be provided in plurality. The external terminals 150 may include a conductive metal material and may include or may be formed of at least one of, for example, tin (Sn), silver (Ag), or zinc (Zn). Each of the external terminals 150 may be electrically connected to a corresponding substrate pad 110 through inner interconnection lines (not shown) in the substrate 100. The external terminals 150 may be connected to an external device. Thus, external signals may be transmitted to the corresponding substrate pads 110 through the external terminals 150. In the present specification, it may be understood that when two components are referred to as being 'electrically connected' to each other, they may be connected directly to each other or at least one intervening component may be present.

The first semiconductor chip 200 may be provided on the top surface 100a of the substrate 100 and may be mounted on the top surface 100a of the substrate 100. The first semiconductor chip 200 may include, for example, a logic chip for controlling a memory chip. The first semiconductor chip 200 may include, for example, a controller. For example, a bottom surface 200b of the first semiconductor chip 200 may be an active surface. A width W1 of the bottom surface 200b of the first semiconductor chip 200 may be greater than a width W2 of a top surface 200a of the first semiconductor chip 200. For example, a difference between the width W1 of the bottom surface 200b of the first semiconductor chip 200 and the width W2 of the top surface 200a of the first semiconductor chip 200 may range from 0.5 mm to 3 mm. In the present specification, the term 'width' may mean a distance measured in a direction (e.g., a first direction D1) parallel to the top surface 100a of the substrate 100. The first semiconductor chip 200 may have a stepped portion ST. For example, the first semiconductor chip 200 may have a L-shape when viewed in a cross-sectional view. A first outer side surface S1 of the first semiconductor chip 200 and a second outer side surface S2 of the first semiconductor chip 200 may be opposite to each other. The second outer side surface S2 of the first semiconductor chip 200 may be adjacent to the lower chip stack 300. An inner side surface S3 of the stepped portion ST may be disposed between the first outer side surface S1 of the first semiconductor chip 200 and the second outer side surface S2 of the first semiconductor chip 200. The first outer side surface S1 of the first semiconductor chip 200 and the inner side surface S3 of the stepped portion ST may be opposite to each other. A height H1 of the first outer side surface S1 of the first semiconductor chip 200 may be greater than a height H2 of the inner side surface S3 of the stepped portion ST. For example, a difference between the height H1 of the first outer side surface S1 of the first semiconductor chip 200 and the height H2 of the inner side surface S3 of the stepped portion ST may range from 150 μm to 450 μm. In the present specification, the term 'height' may mean a distance measured in a direction (e.g., a second direction D2) perpendicular to the top surface 100a of the substrate 100.

The first semiconductor chip 200 may include first chip pads 210 adjacent to its bottom surface 200b. The first chip pads 210 may be exposed at the bottom surface 200b of the first semiconductor chip 200. The first chip pads 210 may be connected to an integrated circuit of the first semiconductor chip 200. The first chip pads 210 may include a conductive metal material and may include or may be formed of at least one of, for example, copper (Cu), aluminum (Al), tungsten (W), or titanium (Ti).

First connection terminals 250 may be disposed between the first semiconductor chip 200 and the substrate 100. The first connection terminals 250 may be disposed between the substrate pads 110 and the first chip pads 210. The substrate 100 and the first semiconductor chip 200 may be electrically connected to each other through the first connection terminals 250. For example, the first connection terminal 250 may include at least one of a solder ball, a bump, or a pillar. The first connection terminal 250 may include a conductive metal material. For example, the first connection terminal 250 may include or may be formed of at least one of tin (Sn), lead (Pb), silver (Ag), zinc (Zn), nickel (Ni), gold (Au), copper (Cu), aluminum (Al), or bismuth (Bi).

A first underfill layer 260 may be disposed between the first semiconductor chip 200 and the substrate 100. The first underfill layer 260 may fill a space between the first connection terminals 250 and may seal or encapsulate the first connection terminals 250. For example, the first underfill layer 260 may include or may be formed of an insulating polymer such as an epoxy-based polymer.

The lower chip stack 300 may be disposed on the substrate 100. The lower chip stack 300 may be horizontally spaced apart from the first semiconductor chip 200 (e.g., in the first direction D1 parallel to the top surface 100a of the substrate 100). The lower chip stack 300 may include a plurality of second semiconductor chips 301, 302, 303 and 304. The second semiconductor chips 301, 302, 303 and 304 may be vertically stacked (e.g., in the second direction D2 perpendicular to the top surface 100a of the substrate 100). For example, a top surface of the lower chip stack 300 (i.e., a top surface of an uppermost second semiconductor chip 304) may be located at substantially the same level in the second direction D2 as a bottom surface 200c of the stepped portion ST. The second semiconductor chips 301, 302, 303 and 304 may include semiconductor chips of which kinds are different from that of the first semiconductor chip 200. The second semiconductor chips 301, 302, 303 and 304 may include memory chips and may include, for example, volatile memory chips such as DRAM chips. In the present specification, the second semiconductor chips 302, 303 and 304 may be referred to as second upper semiconductor chips 302, 303 and 304. In the present specification, the term 'level' may mean a vertical height measured from the top surface 100a of the substrate 100. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Each of the second semiconductor chips 301, 302, 303 and 304 may include second chip pads 310. The second chip pads 310 may be disposed adjacent to a top surface of each of the second semiconductor chips 301, 302, 303 and 304. The second chip pads 310 may be exposed at one or more edges of the top surface of each of the second semiconductor chips 301, 302, 303 and 304. The second chip pad 310 may include a conductive metal material. For example, the second chip pad 310 may include or may be formed of at least one metal of copper (Cu), aluminum (Al), tungsten (W), or titanium (Ti).

Lower connecting portions 350 may be provided on the substrate 100. The lower connecting portions 350 may be disposed on a side surface of the lower chip stack 300. The lower connecting portions 350 may be disposed on side surfaces of the second semiconductor chips 301, 302, 303 and 304. The lower connecting portions 350 may be connected to the substrate pads 110 and the second chip pads 310. The substrate 100 and the second semiconductor chips 301, 302, 303 and 304 may be electrically connected to each other through the lower connecting portions 350. For example, the lower connecting portions 350 may be bonding wires.

Lower adhesive layers 360 may be disposed between the substrate 100 and a lowermost second semiconductor chip 301 and between the second semiconductor chips 301, 302, 303 and 304, respectively. For example, the lower adhesive layer 360 may include an insulating polymer. The lower adhesive layer 360 may include, for example, a die attach film (DAF).

The upper chip stack 400 may be disposed on the substrate 100. The upper chip stack 400 may be disposed on the lower chip stack 300. The upper chip stack 400 may include a plurality of third semiconductor chips 401, 402, 403 and 404. The third semiconductor chips 401, 402, 403 and 404 may be stacked in a cascade shape. For example, the upper chip stack 400 may have a cascade structure descending along the first direction D1. The third semiconductor chips 401, 402, 403 and 404 may include semiconductor chips of which kinds are different from those of the first semiconductor chip 200 and the second semiconductor chips 301, 302, 303 and 304. The third semiconductor chips 401, 402, 403 and 404 may include memory chips and may include, for example, non-volatile memory chips such as NAND flash memory chips. For example, a top surface 400a of the upper chip stack 400 (i.e., a top surface of an uppermost third semiconductor chip 404) may be located at substantially the same level in the second direction D2 as the top surface 200a of the first semiconductor chip 200. In the present specification, the third semiconductor chips 402, 403 and 404 may be referred to as third upper semiconductor chips 402, 403 and 404.

Each of the third semiconductor chips 401, 402, 403 and 404 may include third chip pads 410. The third chip pads 410 may be disposed adjacent to a top surface of each of the third semiconductor chips 401, 402, 403 and 404. The third chip pads 410 may be exposed at one edge (e.g., a right edge) of the top surface of each of the third semiconductor chips 401, 402, 403 and 404. The third chip pad 410 may include a conductive metal material. For example, the third chip pad 410 may include or may be formed of at least one metal of copper (Cu), aluminum (Al) tungsten (W), or titanium (Ti). The third semiconductor chips 401, 402, 403 and 404 may be stacked in a cascade shape in such a way that the third chip pads 410 are exposed.

Upper connecting portions 450 may be provided on the substrate 100. The upper connecting portions 450 may be disposed on a side surface of the upper chip stack 400. The upper connecting portions 450 may be disposed on side surfaces of the third semiconductor chips 401, 402, 403 and 404. The upper connecting portions 450 may be connected to the substrate pads 110 and the third chip pads 410. The substrate 100 and the third semiconductor chips 401, 402, 403 and 404 may be electrically connected to each other through the upper connecting portions 450. For example, the upper connecting portions 450 may be bonding wires.

Chip connecting portions 455 may be provided on the substrate 100. The chip connecting portions 455 may be disposed on the side surface of the upper chip stack 400. The chip connecting portions 455 may be disposed on the side surfaces of the third semiconductor chips 401, 402, 403 and 404. The chip connecting portions 455 may be connected to the third chip pads 410. The third semiconductor chips 401, 402, 403 and 404 may be electrically connected to each other through the chip connecting portions 455. For example, the chip connecting portions 455 may be bonding wires.

Upper adhesive layers 460 may be disposed between the uppermost second semiconductor chip 304 and a lowermost third semiconductor chip 401 and between the third semiconductor chips 401, 402, 403 and 404, respectively. A lowermost upper adhesive layer 460 may be disposed between the uppermost second semiconductor chip 304 and the lowermost third semiconductor chip 401. The lowermost upper adhesive layer 460 may extend onto the stepped portion ST and may be in contact with a portion of the bottom surface 200c of the stepped portion ST. For example, the upper adhesive layer 460 may include an insulating polymer. For example, the upper adhesive layer 460 may include a die attach film (DAF). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A molding layer 500 may be provided on the substrate 100. The molding layer 500 may cover the first semiconductor chip 200, the lower chip stack 300, and the upper chip stack 400. The molding layer 500 may include an insulating polymer such as an epoxy molding compound.

Generally, if a height of a semiconductor chip is different from a height of a chip stack, stress may be concentrated at an interface between the semiconductor chip and a molding layer by a subsequent thermal treatment process, thereby causing a delamination phenomenon that the semiconductor chip is separated from the molding layer. In this case, an additional spacer may be disposed on a top surface of the semiconductor chip so that a total height of the spacer and the semiconductor chip is similar to the height of the chip stack. However, stress applied to an underfill layer between the semiconductor chip and the spacer may be increased to cause a crack in the underfill layer between the semiconductor chip and the spacer and a crack in the semiconductor chip.

According to some embodiments of the present inventive concepts, the first semiconductor chip 200 having the stepped portion ST may be disposed without an additional spacer, and an additional underfill layer may not be disposed on the top surface 200a of the first semiconductor chip 200. In addition, a height of the top surface 200a of the first semiconductor chip 200 may be substantially the same as a height of the top surface 400a of the upper chip stack 400. Thus, it is possible to prevent a delamination phenomenon of the first semiconductor chip 200 and the molding layer 500 by a subsequent thermal treatment process, and it is possible to prevent occurrence of a crack in the first semiconductor chip 200. As a result, a semiconductor package with improved structural stability and reliability may be provided. In addition, a plurality of the chip stacks may be disposed on the substrate, and thus a small and highly integrated semiconductor package may be provided.

Figure 4:
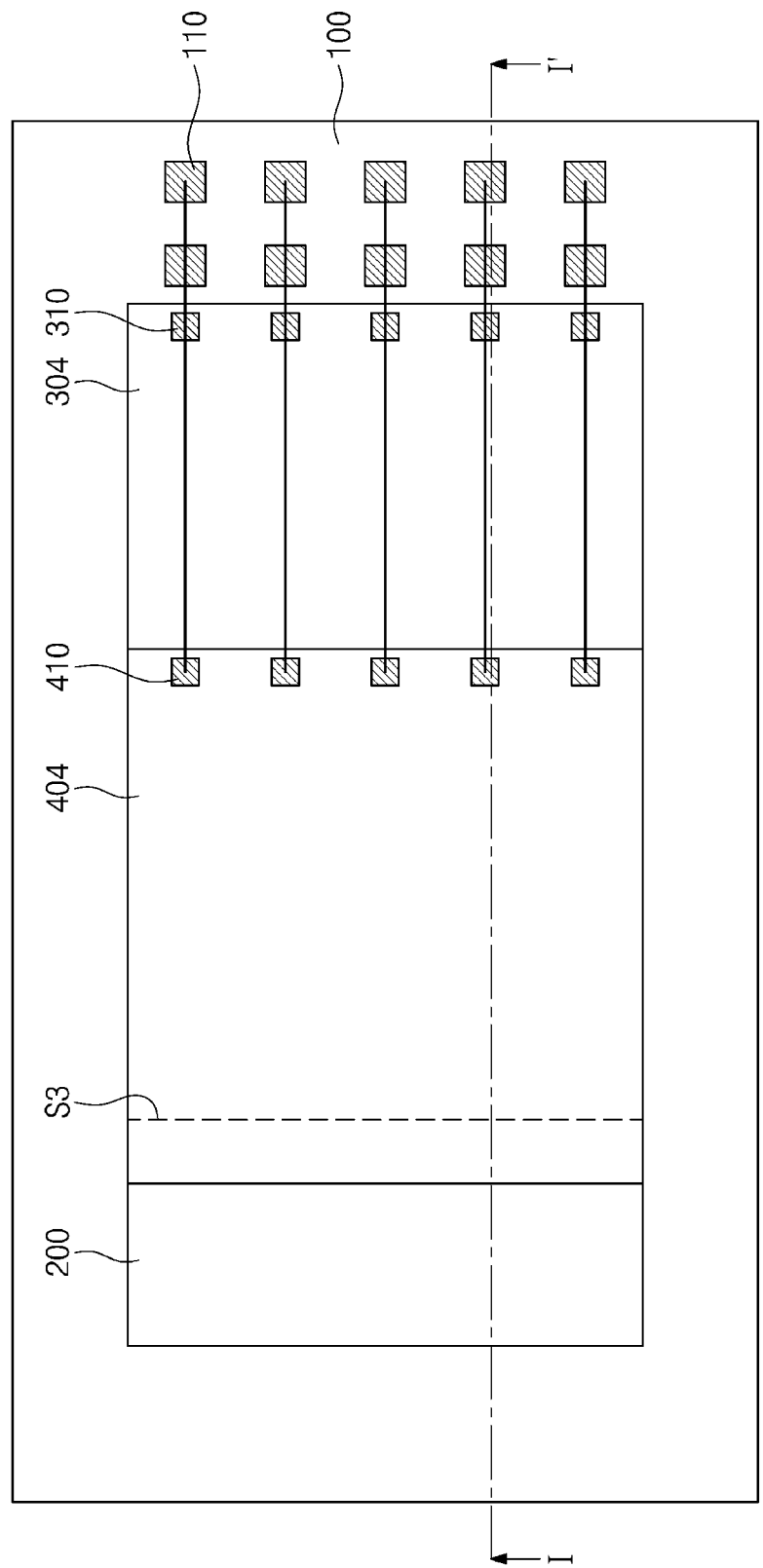
FIG. 4 is a plan view illustrating a semiconductor package according to some embodiments of the present inventive concepts.
Figure 5:
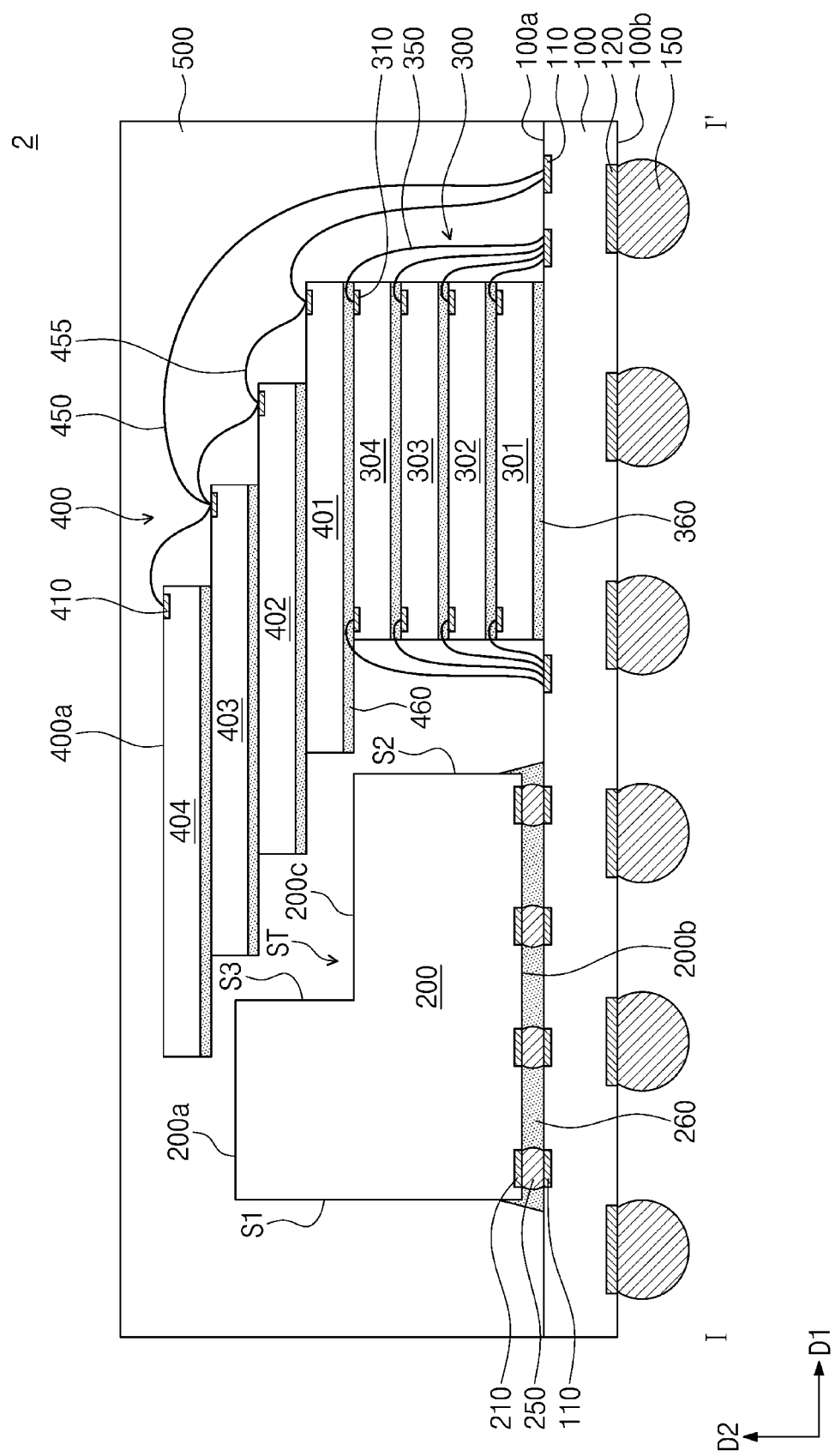
FIG. 5 is a cross-sectional view taken along a line I-I' of FIG. 4 to illustrate a semiconductor package according to some embodiments of the present inventive concepts.

FIG. 4 is a plan view illustrating a semiconductor package according to some embodiments of the present inventive concepts. FIG. 5 is a cross-sectional view taken along a line I-I' of FIG. 4 to illustrate a semiconductor package according to some embodiments of the present inventive concepts. Hereinafter, the descriptions to the same features as in the above embodiments will be omitted for the purpose of ease and convenience in explanation.

Referring to FIGS. 4 and 5, a semiconductor package 2 may include a substrate 100, a first semiconductor chip 200, a lower chip stack 300, and an upper chip stack 400.

The substrate 100 may include substrate pads 110 adjacent to a top surface 100a of the substrate 100 and terminal pads 120 adjacent to a bottom surface 100b of the substrate 100. External terminals 150 may be disposed on the bottom surface 100b of the substrate 100.

The first semiconductor chip 200 may be provided on the top surface 100a of the substrate 100 and may be mounted on the top surface 100a of the substrate 100. The first semiconductor chip 200 may have a stepped portion ST. The first semiconductor chip 200 may include first chip pads 210 adjacent to its bottom surface 200b.

First connection terminals 250 may be disposed between the first semiconductor chip 200 and the substrate 100. A first underfill layer 260 may be disposed between the first semiconductor chip 200 and the substrate 100.

The lower chip stack 300 may be disposed on the substrate 100. The lower chip stack 300 may be horizontally spaced apart from the first semiconductor chip 200 (e.g., in the first direction D1). The lower chip stack 300 may include a plurality of second semiconductor chips 301, 302, 303 and 304. The second semiconductor chips 301, 302, 303 and 304 may be vertically stacked (e.g., in the second direction D2). Each of the second semiconductor chips 301, 302, 303 and 304 may include second chip pads 310.

Lower connecting portions 350 may be disposed on a side surface of the lower chip stack 300. Lower adhesive layers 360 may be disposed between the substrate 100 and a lowermost second semiconductor chip 301 and between the second semiconductor chips 301, 302, 303 and 304, respectively.

The upper chip stack 400 may be disposed on the substrate 100. The upper chip stack 400 may be disposed on the lower chip stack 300. The upper chip stack 400 may include a plurality of third semiconductor chips 401, 402, 403 and 404. The third semiconductor chips 401, 402, 403 and 404 may be stacked in a cascade shape. The third semiconductor chips 401, 402, 403 and 404 may be spaced apart from the first semiconductor chip 200. The third semiconductor chips 401, 402, 403 and 404 may be spaced apart from an inner side surface S3 of the stepped portion ST. For example, a top surface 400a of the upper chip stack 400 (i.e., a top surface of an uppermost third semiconductor chip 404) may be located at a higher level than a top surface 200a of the first semiconductor chip 200. Each of the third semiconductor chips 401, 402, 403 and 404 may include third chip pads 410.

Upper connecting portions 450 may be disposed on a side surface of the upper chip stack 400. Chip connecting portions 455 may be provided on the substrate 100. The chip connecting portions 455 may be disposed on side surfaces of the third semiconductor chips 401, 402, 403 and 404.

Upper adhesive layers 460 may be disposed between an uppermost second semiconductor chip 304 and a lowermost third semiconductor chip 401 and between the third semiconductor chips 401, 402, 403 and 404, respectively. A lowermost upper adhesive layer 460 may not be in contact with a bottom surface 200c of the stepped portion ST but may be spaced apart from the bottom surface 200c of the stepped portion ST. An uppermost upper adhesive layer 460 may not be in contact with the top surface 200a of the first semiconductor chip 200 but may be spaced apart from the top surface 200a of the first semiconductor chip 200.

A molding layer 500 may be provided on the substrate 100 to cover the first semiconductor chip 200, the lower chip stack 300, and the upper chip stack 400.

Figure 6:
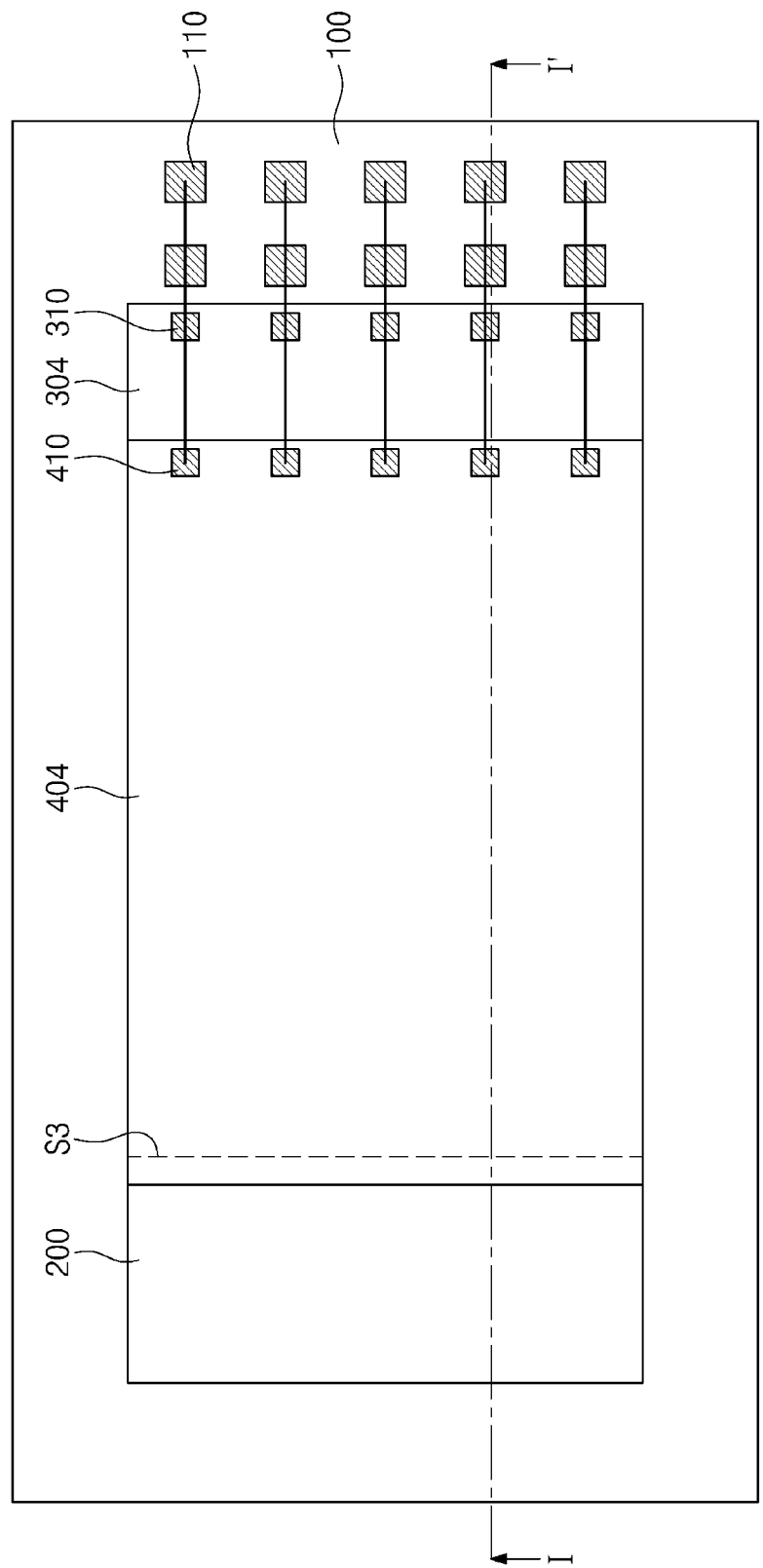
FIG. 6 is a plan view illustrating a semiconductor package according to some embodiments of the present inventive concepts.
Figure 7:
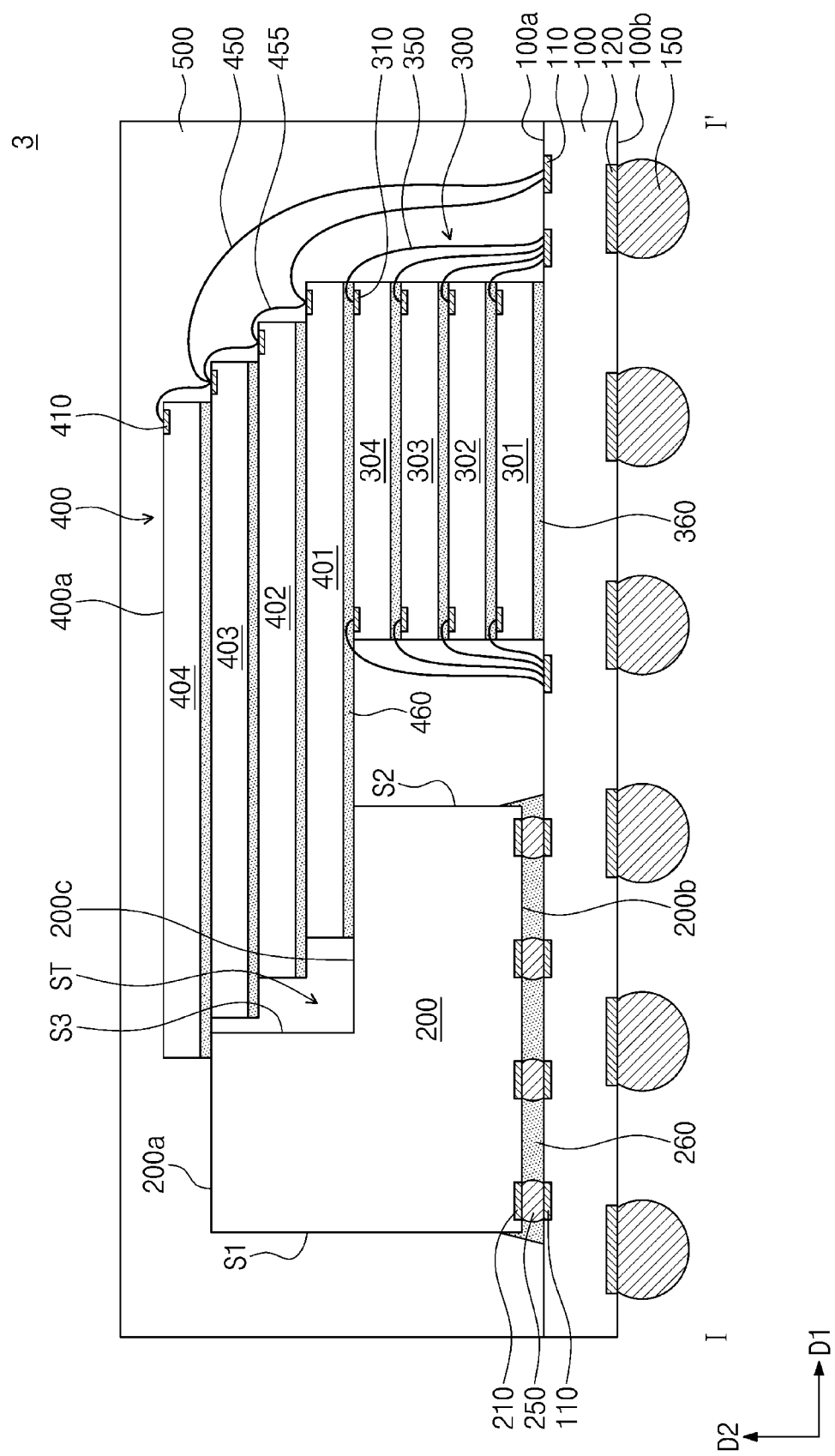
FIG. 7 is a cross-sectional view taken along a line I-I' of FIG. 6 to illustrate a semiconductor package according to some embodiments of the present inventive concepts.

FIG. 6 is a plan view illustrating a semiconductor package according to some embodiments of the present inventive concepts. FIG. 7 is a cross-sectional view taken along a line I-I' of FIG. 6 to illustrate a semiconductor package according to some embodiments of the present inventive concepts. Hereinafter, the descriptions to the same features as in the above embodiments will be omitted for the purpose of ease and convenience in explanation.

Referring to FIGS. 6 and 7, a semiconductor package 3 may include a substrate 100, a first semiconductor chip 200, a lower chip stack 300, and an upper chip stack 400.

The substrate 100 may include substrate pads 110 adjacent to a top surface 100a of the substrate 100 and terminal pads 120 adjacent to a bottom surface 100b of the substrate 100. External terminals 150 may be disposed on the bottom surface 100b of the substrate 100.

The first semiconductor chip 200 may be provided on the top surface 100a of the substrate 100 and may be mounted on the top surface 100a of the substrate 100. The first semiconductor chip 200 may have a stepped portion ST. The first semiconductor chip 200 may include first chip pads 210 adjacent to its bottom surface 200b.

First connection terminals 250 may be disposed between the first semiconductor chip 200 and the substrate 100. A first underfill layer 260 may be disposed between the first semiconductor chip 200 and the substrate 100.

The lower chip stack 300 may be disposed on the substrate 100. The lower chip stack 300 may be horizontally spaced apart from the first semiconductor chip 200 (e.g., in the first direction D1). The lower chip stack 300 may include a plurality of second semiconductor chips 301, 302, 303 and 304. The second semiconductor chips 301, 302, 303 and 304 may be vertically stacked (e.g., in the second direction D2). Each of the second semiconductor chips 301, 302, 303 and 304 may include second chip pads 310.

Lower connecting portions 350 may be disposed on a side surface of the lower chip stack 300. Lower adhesive layers 360 may be disposed between the substrate 100 and a lowermost second semiconductor chip 301 and between the second semiconductor chips 301, 302, 303 and 304, respectively.

The upper chip stack 400 may be disposed on the lower chip stack 300. The upper chip stack 400 may include a plurality of third semiconductor chips 401, 402, 403 and 404. The third semiconductor chips 401, 402, 403 and 404 may be stacked in a cascade shape. For example, a top surface 400a of the upper chip stack 400 (i.e., a top surface of an uppermost third semiconductor chip 404) may be located at a higher level than a top surface 200a of the first semiconductor chip 200. Each of the third semiconductor chips 401, 402, 403 and 404 may include third chip pads 410.

Upper connecting portions 450 may be disposed on a side surface of the upper chip stack 400. Chip connecting portions 455 may be provided on the substrate 100. The chip connecting portions 455 may be disposed on side surfaces of the third semiconductor chips 401, 402, 403 and 404.

Upper adhesive layers 460 may be disposed between an uppermost second semiconductor chip 304 and a lowermost third semiconductor chip 401 and between the third semiconductor chips 401, 402, 403 and 404, respectively. A lowermost upper adhesive layer 460 may extend onto the stepped portion ST so as to be in contact with a portion of a bottom surface 200c of the stepped portion ST. An uppermost upper adhesive layer 460 may be disposed between the third semiconductor chips 403 and 404 and may extend onto the top surface 200a of the first semiconductor chip 200. The uppermost upper adhesive layer 460 may be in contact with the top surface 200a of the first semiconductor chip 200.

A molding layer 500 may be provided on the substrate 100 to cover the first semiconductor chip 200, the lower chip stack 300, and the upper chip stack 400.

Figure 8:
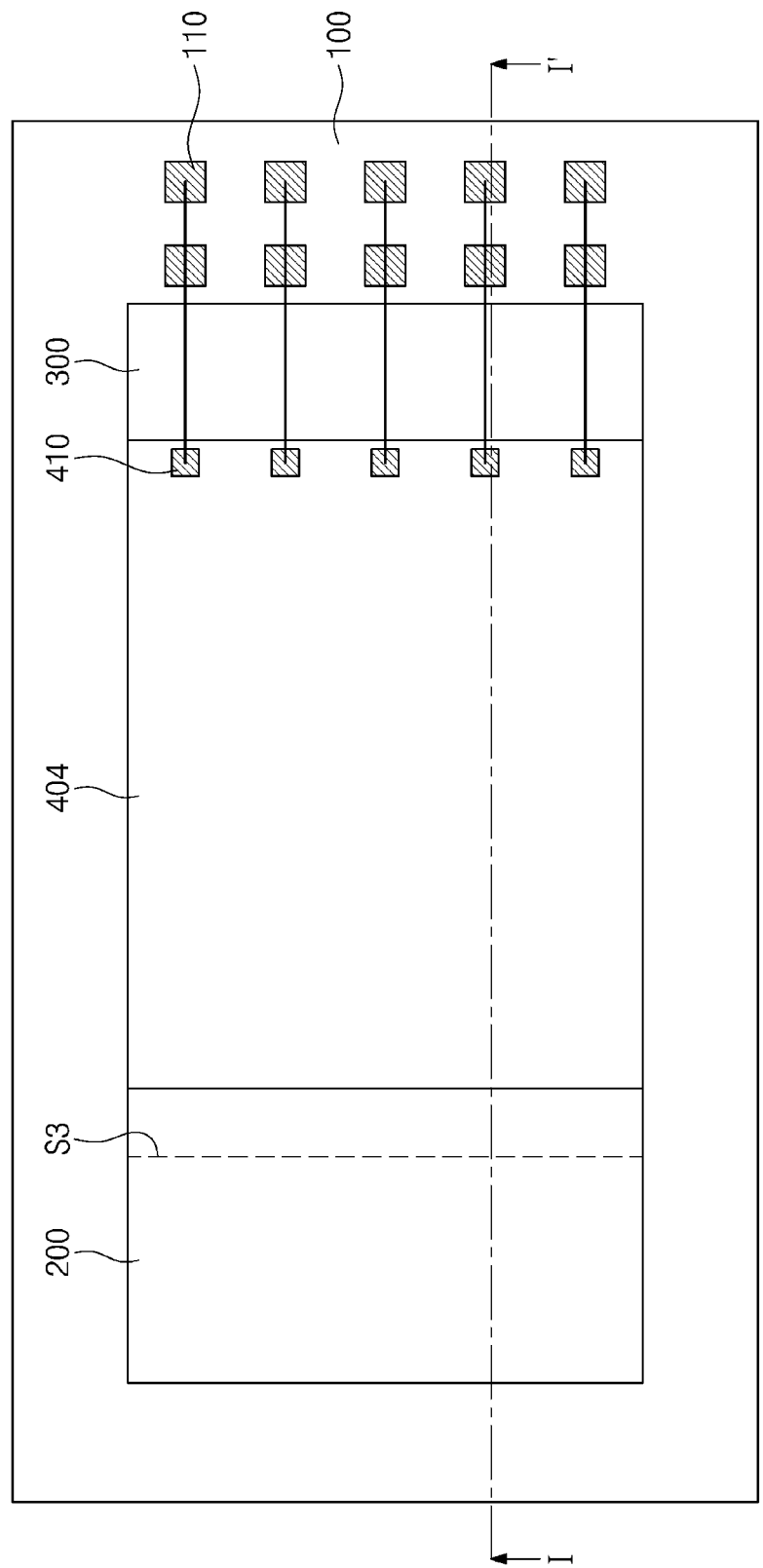
FIG. 8 is a plan view illustrating a semiconductor package according to some embodiments of the present inventive concepts.
Figure 9:
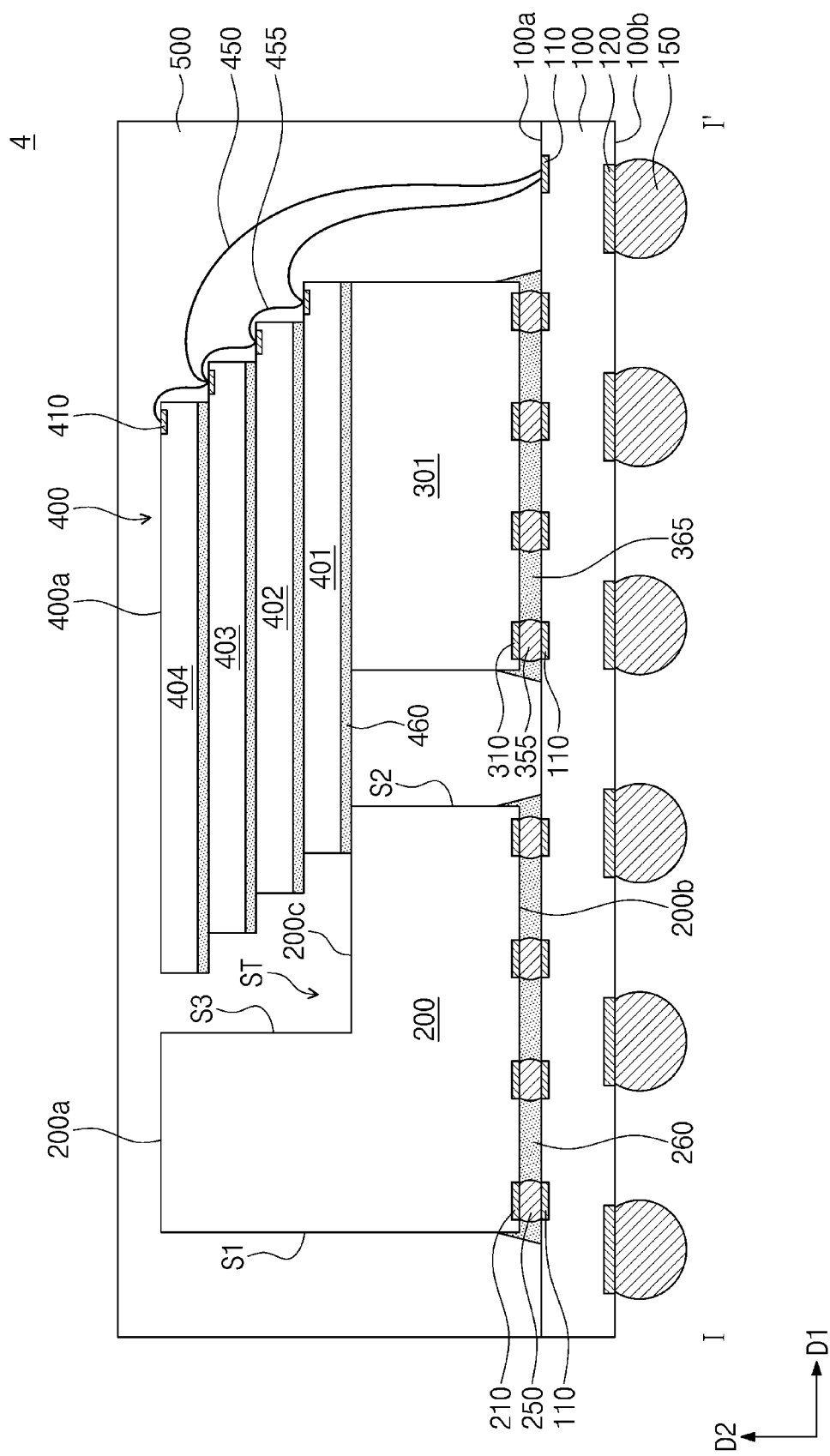
FIG. 9 is a cross-sectional view taken along a line I-I' of FIG. 8 to illustrate a semiconductor package according to some embodiments of the present inventive concepts.

FIG. 8 is a plan view illustrating a semiconductor package according to some embodiments of the present inventive concepts. FIG. 9 is a cross-sectional view taken along a line I-I' of FIG. 8 to illustrate a semiconductor package according to some embodiments of the present inventive concepts. Hereinafter, the descriptions to the same features as in the above embodiments will be omitted for the purpose of ease and convenience in explanation.

Referring to FIGS. 8 and 9, a semiconductor package 4 may include a substrate 100, a first semiconductor chip 200, a second semiconductor chip 301, and an upper chip stack 400.

The substrate 100 may include substrate pads 110 adjacent to a top surface 100a of the substrate 100 and terminal pads 120 adjacent to a bottom surface 100b of the substrate 100. External terminals 150 may be disposed on the bottom surface 100b of the substrate 100.

The first semiconductor chip 200 may be provided on the top surface 100a of the substrate 100 and may be mounted on the top surface 100a of the substrate 100. The first semiconductor chip 200 may have a stepped portion ST. The first semiconductor chip 200 may include first chip pads 210 adjacent to its bottom surface 200b.

First connection terminals 250 may be disposed between the first semiconductor chip 200 and the substrate 100. A first underfill layer 260 may be disposed between the first semiconductor chip 200 and the substrate 100.

The second semiconductor chip 301 may be mounted on the substrate 100. The second semiconductor chip 301 may be horizontally spaced apart from the first semiconductor chip 200 (e.g., in the first direction D1). The second semiconductor chip 301 may include a memory chip and may include, for example, a volatile memory chip such as a DRAM chip. The second semiconductor chip 301 may include second chip pads 310 adjacent to its bottom surface.

Second connection terminals 355 may be disposed between the substrate 100 and the second semiconductor chip 301. The second connection terminals 355 may be disposed between the substrate pads 110 and the second chip pads 310. The substrate 100 and the second semiconductor chip 301 may be electrically connected to each other through the second connection terminals 355. For example, the second connection terminal 355 may include at least one of a solder ball, a bump, or a pillar. The second connection terminal 355 may include a conductive metal material. For example, the second connection terminal 355 may include or may be formed of at least one of tin (Sn), lead (Pb), silver (Ag), zinc (Zn), nickel (Ni), gold (Au), copper (Cu), aluminum (Al), or bismuth (Bi).

A second underfill layer 365 may be disposed between the second semiconductor chip 301 and the substrate 100. The second underfill layer 365 may fill a space between the second connection terminals 355 and may seal or encapsulate the second connection terminals 355. For example, the second underfill layer 365 may include an insulating polymer such as an epoxy-based polymer.

The upper chip stack 400 may be disposed on the second semiconductor chip 301. The upper chip stack 400 may include a plurality of third semiconductor chips 401, 402, 403 and 404. The third semiconductor chips 401, 402, 403 and 404 may be stacked in a cascade shape. For example, a top surface 400a of the upper chip stack 400 (i.e., a top surface of an uppermost third semiconductor chip 404) may be located at substantially the same level in the second direction D2 as a top surface 200a of the first semiconductor chip 200. Each of the third semiconductor chips 401, 402, 403 and 404 may include third chip pads 410.

Upper connecting portions 450 may be disposed on a side surface of the upper chip stack 400. Chip connecting portions 455 may be disposed on side surfaces of the third semiconductor chips 401, 402, 403 and 404.

Upper adhesive layers 460 may be disposed between the second semiconductor chip 301 and a lowermost third semiconductor chip 401 and between the third semiconductor chips 401, 402, 403 and 404, respectively. A lowermost upper adhesive layer 460 may extend onto the stepped portion ST and may be in contact with a portion of a bottom surface 200c of the stepped portion ST.

A molding layer 500 may be provided on the substrate 100 to cover the first semiconductor chip 200, the second semiconductor chip 301, and the upper chip stack 400.

Figure 10:
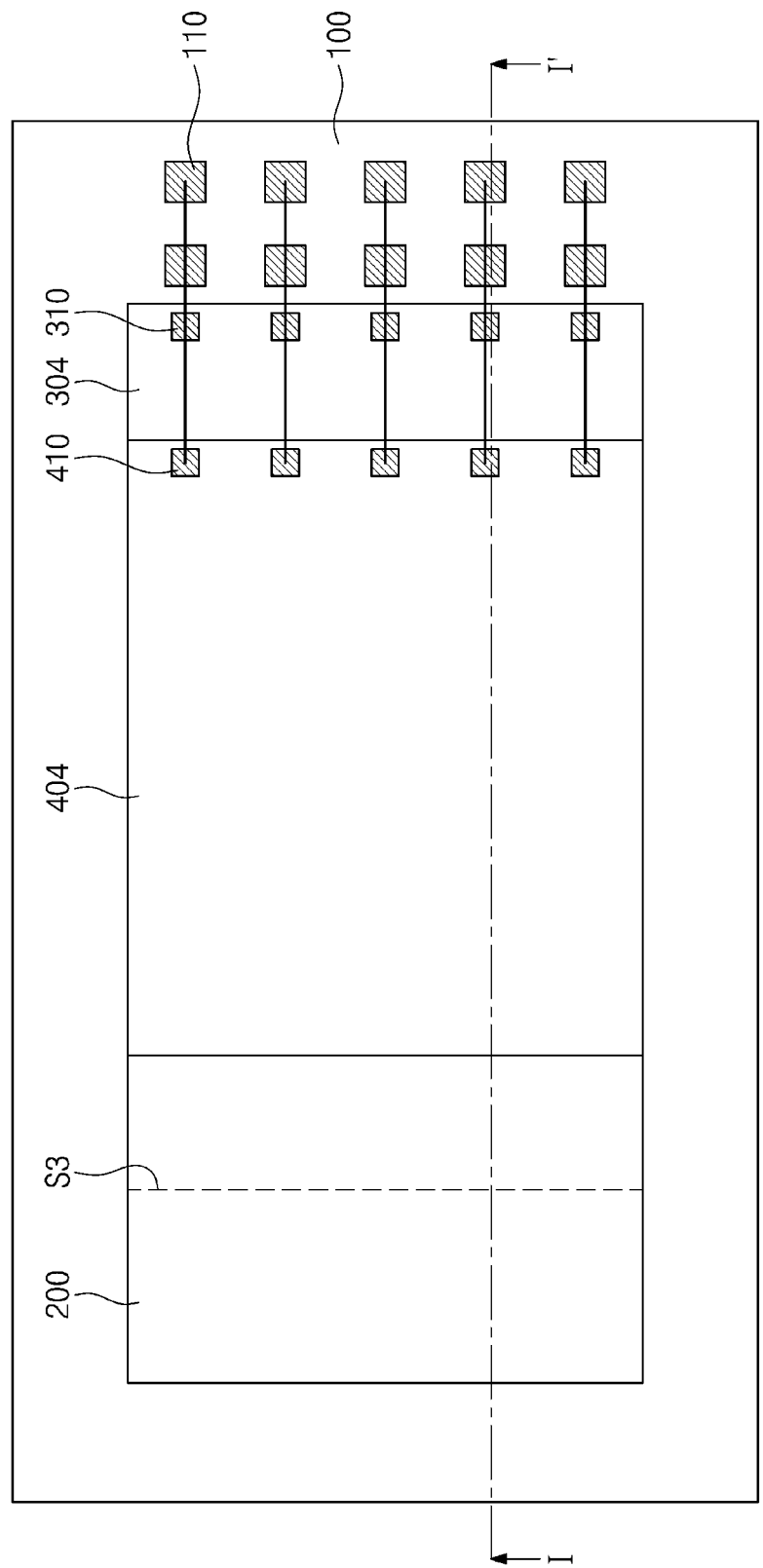
FIG. 10 is a plan view illustrating a semiconductor package according to some embodiments of the present inventive concepts.
Figure 11:
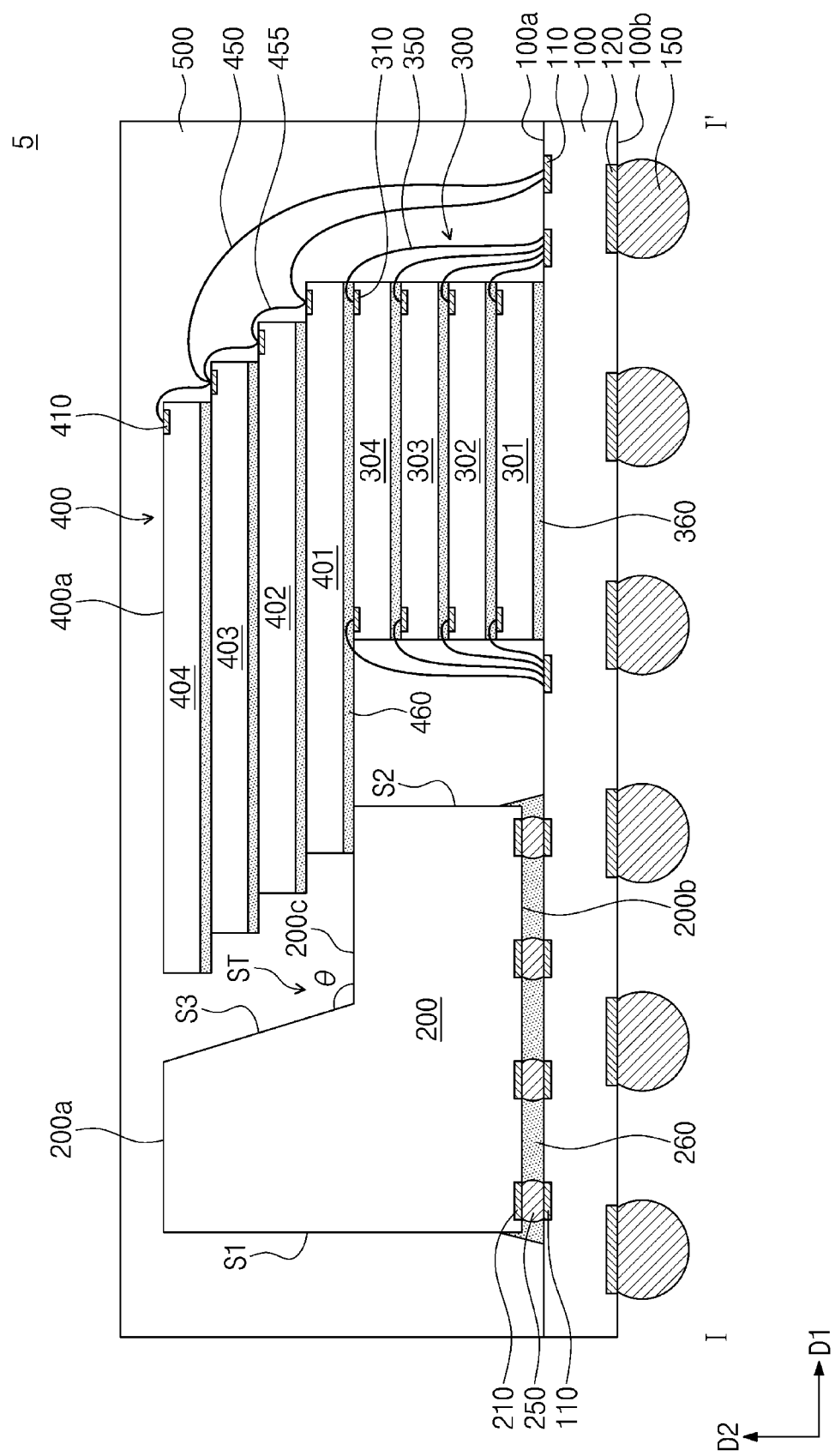
FIG. 11 is a cross-sectional view taken along a line I-I' of FIG. 10 to illustrate a semiconductor package according to some embodiments of the present inventive concepts.

FIG. 10 is a plan view illustrating a semiconductor package according to some embodiments of the present inventive concepts. FIG. 11 is a cross-sectional view taken along a line I-I' of FIG. 10 to illustrate a semiconductor package according to some embodiments of the present inventive concepts. Hereinafter, the descriptions to the same features as in the above embodiments will be omitted for the purpose of ease and convenience in explanation.

Referring to FIGS. 10 and 11, a semiconductor package 5 may include a substrate 100, a first semiconductor chip 200, a lower chip stack 300, and an upper chip stack 400.

The substrate 100 may include substrate pads 110 adjacent to a top surface 100a of the substrate 100 and terminal pads 120 adjacent to a bottom surface 100b of the substrate 100. External terminals 150 may be disposed on the bottom surface 100b of the substrate 100.

The first semiconductor chip 200 may be provided on the top surface 100a of the substrate 100 and may be mounted on the top surface 100a of the substrate 100. The first semiconductor chip 200 may have a stepped portion ST. An inner side surface S3 of the stepped portion ST may be inclined. An angle θ between a bottom surface 200c of the stepped portion ST and the inner side surface S3 of the stepped portion ST may be, for example, an obtuse angle. The first semiconductor chip 200 may include first chip pads 210 adjacent to its bottom surface 200b.

First connection terminals 250 may be disposed between the first semiconductor chip 200 and the substrate 100. A first underfill layer 260 may be disposed between the first semiconductor chip 200 and the substrate 100.

The lower chip stack 300 may be disposed on the substrate 100. The lower chip stack 300 may be horizontally spaced apart from the first semiconductor chip 200 (e.g., in the first direction D1). The lower chip stack 300 may include a plurality of second semiconductor chips 301, 302, 303 and 304. The second semiconductor chips 301, 302, 303 and 304 may be vertically stacked (e.g., in the second direction D2). Each of the second semiconductor chips 301, 302, 303 and 304 may include second chip pads 310.

Lower connecting portions 350 may be disposed on a side surface of the lower chip stack 300. Lower adhesive layers 360 may be disposed between the substrate 100 and a lowermost second semiconductor chip 301 and between the second semiconductor chips 301, 302, 303 and 304, respectively.

The upper chip stack 400 may be disposed on the lower chip stack 300. The upper chip stack 400 may include a plurality of third semiconductor chips 401, 402, 403 and 404. The third semiconductor chips 401, 402, 403 and 404 may be stacked in a cascade shape. For example, a top surface 400a of the upper chip stack 400 (i.e., a top surface of an uppermost third semiconductor chip 404) may be located at substantially the same level as a top surface 200a of the first semiconductor chip 200. Each of the third semiconductor chips 401, 402, 403 and 404 may include third chip pads 410.

Upper connecting portions 450 may be disposed on a side surface of the upper chip stack 400. Chip connecting portions 455 may be disposed on side surfaces of the third semiconductor chips 401, 402, 403 and 404.

Upper adhesive layers 460 may be disposed between an uppermost second semiconductor chip 304 and a lowermost third semiconductor chip 401 and between the third semiconductor chips 401, 402, 403 and 404, respectively. A lowermost upper adhesive layer 460 may extend onto the stepped portion ST and may be in contact with a portion of the bottom surface 200c of the stepped portion ST.

A molding layer 500 may be provided on the substrate 100 to cover the first semiconductor chip 200, the lower chip stack 300, and the upper chip stack 400.

Figure 12:
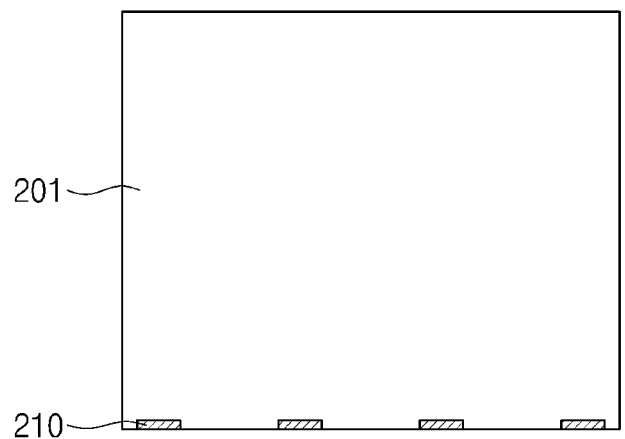
FIGS. 12, 13, 14, 15, 16 and 17 are cross-sectional views illustrating a method of manufacturing a semiconductor package according to some embodiments of the present inventive concepts.

FIGS. 12, 13, 14, 15, 16 and 17 are cross-sectional views illustrating a method of manufacturing a semiconductor package according to some embodiments of the present inventive concepts Referring to FIG. 12, a preliminary semiconductor chip 201 may be provided. The preliminary semiconductor chip 201 may include a logic chip for controlling a memory chip and may include, for example, a controller. For example, a bottom surface of the preliminary semiconductor chip 201 may be an active surface. The preliminary semiconductor chip 201 may be, for example, a wafer-level chip. Thereafter, a dicing process may be performed on the preliminary semiconductor chip 201 to separate a plurality of the preliminary semiconductor chips 201 from each other. Hereinafter, a single preliminary semiconductor chip 201 will be mainly described for the purpose of ease and convenience in explanation.

The preliminary semiconductor chip 201 may include first chip pads 210 adjacent to its bottom surface. The first chip pads 210 may be exposed at the bottom surface of the preliminary semiconductor chip 201. The first chip pads 210 may include a conductive metal material and may include or may be formed of at least one of, for example, copper (Cu), aluminum (Al), tungsten (W), or titanium (Ti).

Figure 13:
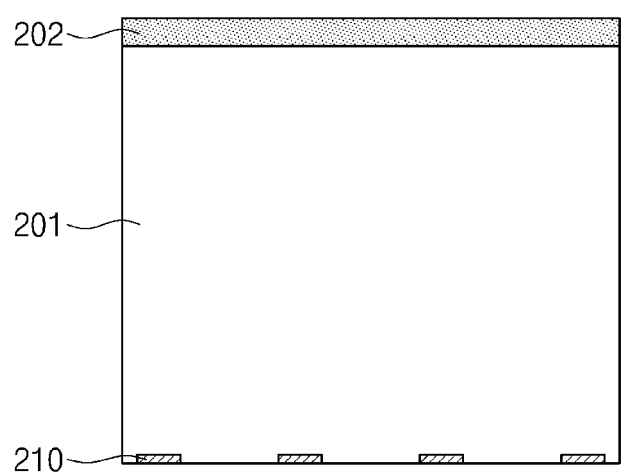

Referring to FIG. 13, a protective layer 202 may be formed on a top surface of the preliminary semiconductor chip 201. The protective layer 202 may cover the top surface of the preliminary semiconductor chip 201. For example, the protective layer 202 may include an insulating polymer. The protective layer 202 may include, for example, a die attach film (DAF).

Figure 14:
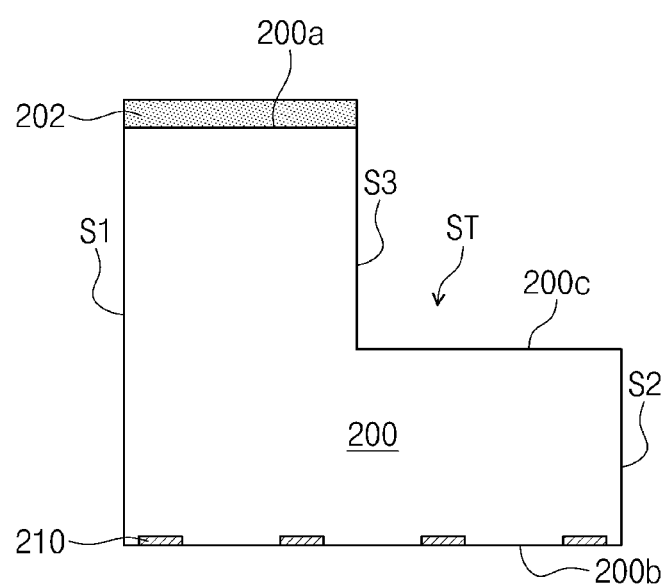

Referring to FIG. 14, an etching process may be performed on the protective layer 202. A portion of the protective layer 202 may be etched by the etching process. A portion of the preliminary semiconductor chip 201 may be etched by the etching process to form a first semiconductor chip 200 having a stepped portion ST. A first outer side surface S1 of the first semiconductor chip 200 may be opposite to a second outer side surface S2 of the first semiconductor chip 200. An inner side surface S3 of the stepped portion ST may be disposed between the first outer side surface S1 of the first semiconductor chip 200 and the second outer side surface S2 of the first semiconductor chip 200. The first outer side surface S1 of the first semiconductor chip 200 may be opposite to the inner side surface S3 of the stepped portion ST. For example, the etching process may include an etching process using plasma.

Figure 15:
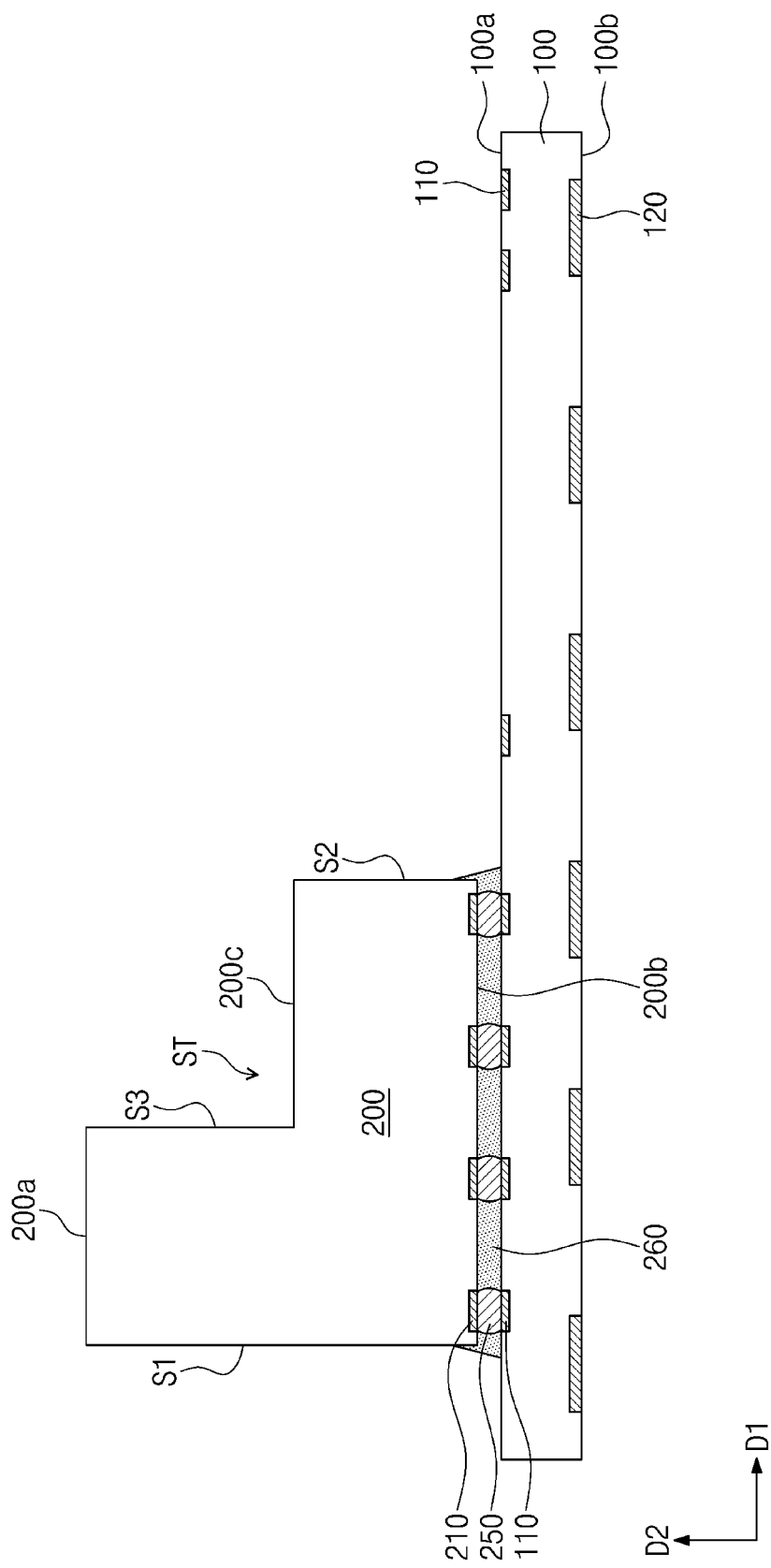

Referring to FIG. 15, the protective layer 202 may be removed, and a top surface 200a of the first semiconductor chip 200 may be exposed. The removal of the protective layer 202 may be performed by, for example, a laser grooving process. The first semiconductor chip 200 may be manufactured by the above processes.

A substrate 100 may be provided. The substrate 100 may include substrate pads 110 and terminal pads 120. The substrate pads 110 may be disposed adjacent to a top surface 100a of the substrate 100 and may be exposed at the top surface 100a of the substrate 100. The terminal pads 120 may be disposed adjacent to a bottom surface 100b of the substrate 100 and may be exposed at the bottom surface 100b of the substrate 100.

The first semiconductor chip 200 may be mounted on the substrate 100. The mounting of the first semiconductor chip 200 on the substrate 100 may include forming a first connection terminal 250 between a corresponding one of the substrate pads 110 and a corresponding one of the first chip pads 210. The substrate 100 and the first semiconductor chip 200 may be electrically connected to each other through the first connection terminals 250.

A first underfill layer 260 may be formed between the first semiconductor chip 200 and the substrate 100. The first underfill layer 260 may fill a space between the first connection terminals 250 and may seal or encapsulate the first connection terminals 250.

Figure 16:
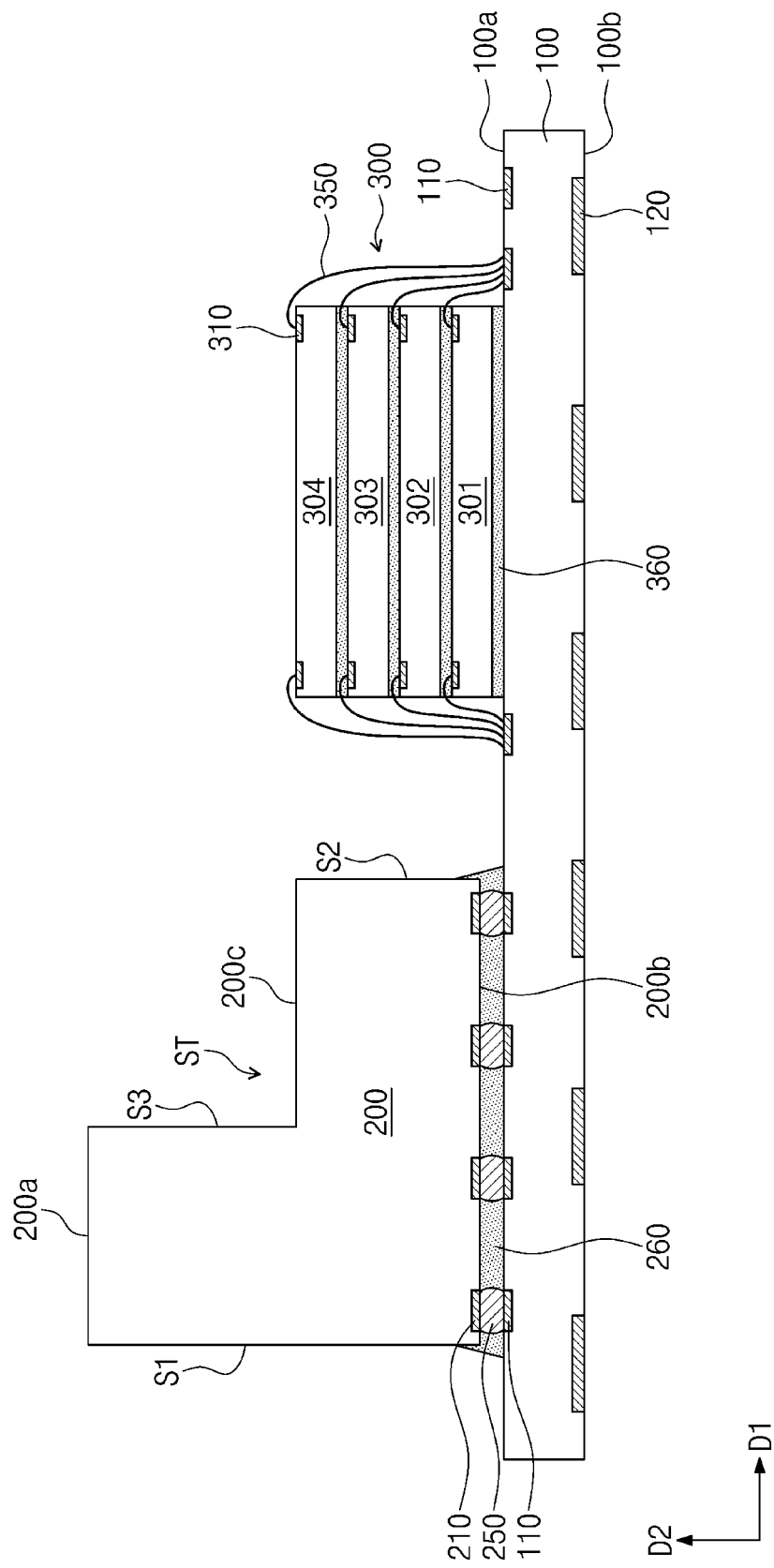

Referring to FIG. 16, a lower chip stack 300 may be formed on the substrate 100. The lower chip stack 300 may be horizontally spaced apart from the first semiconductor chip 200 (e.g., in the first direction D1). The second outer side surface S2 of the first semiconductor chip 200 may be adjacent to the lower chip stack 300.

The formation of the lower chip stack 300 may include forming a plurality of second semiconductor chips 301, 302, 303 and 304 on the substrate 100. A lowermost second semiconductor chip 301 may be adhered onto the substrate 100 by a lower adhesive layer 360 formed on a bottom surface of the lowermost second semiconductor chip 301. Second semiconductor chips 302, 303 and 304 may be vertically stacked (i.e., in the second direction D2) on the lowermost second semiconductor chip 301. The second semiconductor chips 302, 303 and 304 may be adhered onto the lowermost second semiconductor chip 301 by lower adhesive layers 360 formed on bottom surfaces of the second semiconductor chips 302, 303 and 304. Each of the second semiconductor chips 301, 302, 303 and 304 may include second chip pads 310 formed on its top surface.

The formation of the lower chip stack 300 may further include forming lower connecting portions 350 electrically connecting the substrate pads 110 to the second chip pads 310. The lower connecting portions 350 may be formed on the substrate 100 and may be formed on side surfaces of the second semiconductor chips 301, 302, 303 and 304.

Figure 17:
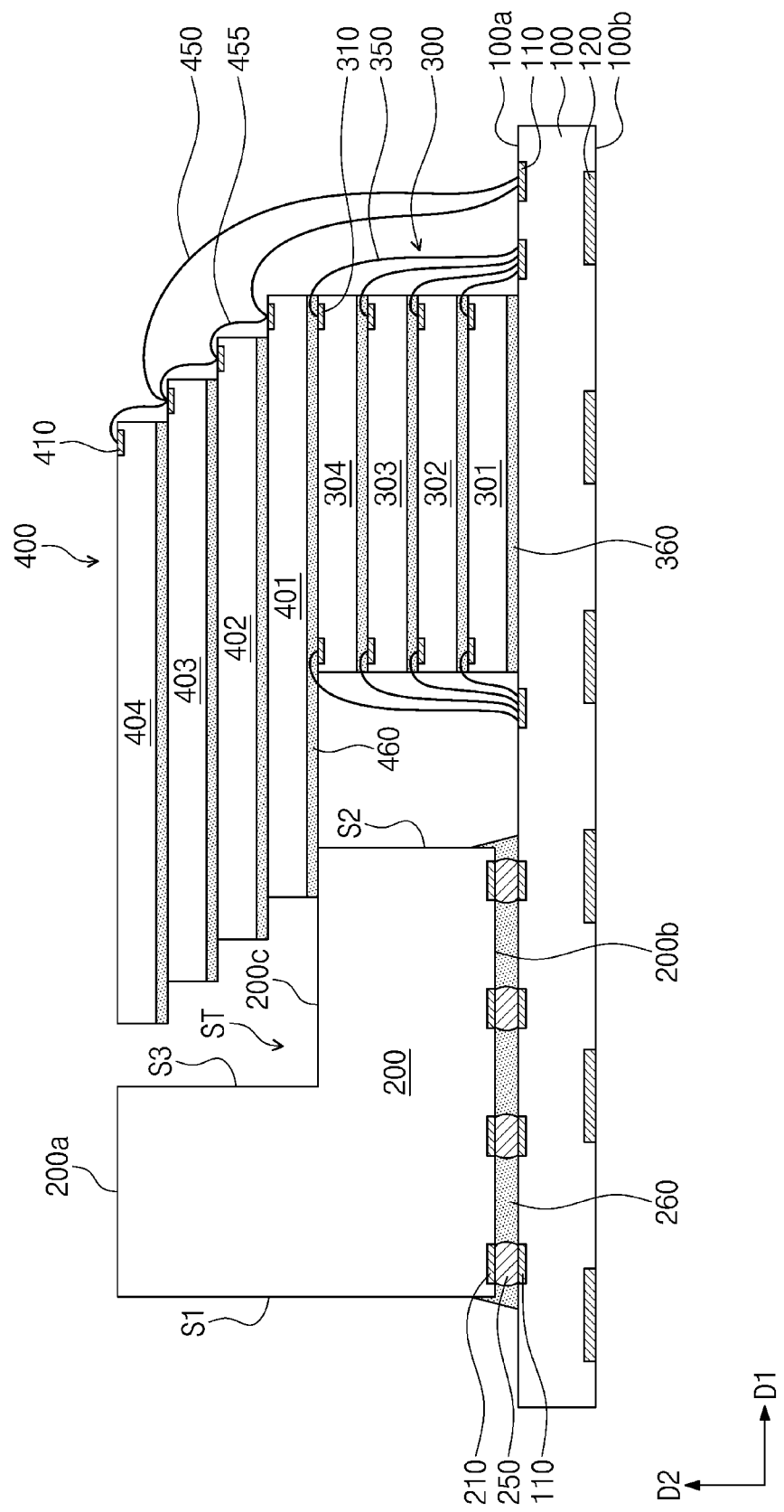

Referring to FIG. 17, an upper chip stack 400 may be formed on the lower chip stack 300. The upper chip stack 400 may be formed on an uppermost second semiconductor chip 304.

The formation of the upper chip stack 400 may include forming a plurality of third semiconductor chips 401, 402, 403 and 404 on the lower chip stack 300. A lowermost third semiconductor chip 401 may be adhered onto the lower chip stack 300 by an upper adhesive layer 460 formed on a bottom surface of the lowermost third semiconductor chip 401. The upper adhesive layer 460 on the bottom surface of the lowermost third semiconductor chip 401 may extend onto the stepped portion ST so as to be adhered to a bottom surface 200c of the stepped portion ST.

Third semiconductor chips 402, 403 and 404 may be stacked in a cascade shape on the lowermost third semiconductor chip 401. The third semiconductor chips 402, 403 and 404 may be adhered onto the lowermost third semiconductor chip 401 by upper adhesive layers 460 formed on bottom surfaces of the third semiconductor chips 402, 403 and 404. Each of the third semiconductor chips 401, 402, 403 and 404 may include third chip pads 410 formed on its top surface. The upper chip stack 400 may be formed in such a way that the third chip pads 410 are exposed on one edge (e.g., a right edge) of the top surface of each of the third semiconductor chips 401, 402, 403 and 404. In other words, the upper chip stack 400 may be formed to have, for example, a cascade structure descending along the first direction D1.

The formation of the upper chip stack 400 may further include forming upper connecting portions 450 electrically connecting the substrate pads 110 to the third chip pads 410, and chip connecting portions 455 electrically connecting the third chip pads 410 to each other. The upper connecting portions 450 and the chip connecting portions 455 may be formed on the substrate 100 and may be formed on side surfaces of the third semiconductor chips 401, 402, 403 and 404.

Referring again to FIGS. 1 and 2, a molding layer 500 may be formed on the substrate 100 to cover the first semiconductor chip 200, the lower chip stack 300, and the upper chip stack 400. External terminals 150 may be formed on the bottom surface 100b of the substrate 100. The external terminals 150 may be formed on bottom surfaces of the terminal pads 120. The semiconductor package 1 may be manufactured by the above processes.

According to some embodiments of the present inventive concepts, since a process for forming an additional spacer is not performed, costs of processes of manufacturing a semiconductor package may be reduced.

According to some embodiments of the present inventive concepts, the first semiconductor chip having the stepped portion may be disposed without an additional spacer, and an additional underfill layer may not be disposed on the top surface of the first semiconductor chip. In addition, the height of the top surface of the first semiconductor chip and the height of the top surface of the upper chip stack may be balanced by the disclosed process. Thus, it is possible to prevent a delamination phenomenon of the first semiconductor chip and the molding layer by a subsequent thermal treatment process, and it is possible to prevent occurrence of a crack in the first semiconductor chip. As a result, the semiconductor package with improved structural stability and reliability may be provided. In addition, a plurality of chip stacks may be disposed on the substrate, and thus the small and highly integrated semiconductor package may be provided.

According to some embodiments of the present inventive concepts, since a process for forming an additional spacer is not performed, costs of processes of manufacturing a semiconductor package may be reduced.

While example embodiments of the present inventive concepts have been particularly shown and described, it will be understood by one of ordinary skill in the art that variations in form and detail may be made therein without departing from the spirit and scope of the attached claims.

What is claimed is:

1. A semiconductor package comprising:
a substrate extending in a first direction and a second direction perpendicular to the first direction;
a first semiconductor chip disposed on the substrate, the first semiconductor chip having a stepped portion;
a second semiconductor chip disposed on the substrate and horizontally spaced apart from the first semiconductor chip in the first direction;
a third semiconductor chip disposed on the second semiconductor chip and a bottom surface of the stepped portion; and
an upper adhesive layer disposed between the second semiconductor chip and the third semiconductor chip, the upper adhesive layer contacting a portion of the bottom surface of the stepped portion,
wherein a kind of the first semiconductor chip is different from a kind of the second semiconductor chip and a kind of the third semiconductor chip.

2. The semiconductor package of claim 1, wherein a first outer side surface of the first semiconductor chip is opposite to an inner side surface of the stepped portion,
wherein a width, in the first direction, of a top surface of the first semiconductor chip is less than a width, in the first direction, of a bottom surface of the first semiconductor chip, and
wherein a height, in a third direction perpendicular to the first direction and second direction, of the first outer side surface of the first semiconductor chip is greater than a height, in the third direction, of the inner side surface of the stepped portion.

3. The semiconductor package of claim 1, further comprising:
a plurality of second upper semiconductor chips on the second semiconductor chip and stacked in a third direction perpendicular to the first direction and second direction; and
a plurality of third upper semiconductor chips on the third semiconductor chip and stacked in a cascade shape.

4. The semiconductor package of claim 3, wherein a top surface of an uppermost third upper semiconductor chip of the third upper semiconductor chips is located at the same level, in the third direction, as a top surface of the first semiconductor chip.

5. The semiconductor package of claim 3, wherein a top surface of an uppermost second upper semiconductor chip of the second upper semiconductor chips is located at the same level, in the third direction, as the bottom surface of the stepped portion.

6. The semiconductor package of claim 3, wherein a top surface of an uppermost third upper semiconductor chip of the third upper semiconductor chips is located at a higher level, in the third direction, than a top surface of the first semiconductor chip.

7. The semiconductor package of claim 1, wherein a kind of the second semiconductor chip is different from a kind of the third semiconductor chip.

8. The semiconductor package of claim 1, further comprising:
substrate pads disposed adjacent to a top surface of the substrate;
first chip pads disposed adjacent to a bottom surface of the first semiconductor chip;
second chip pads disposed adjacent to a bottom surface of the second semiconductor chip;
first connection terminals between a first subset of the substrate pads and the first chip pads; and
second connection terminals between a second subset of the substrate pads and the second chip pads.

9. The semiconductor package of claim 1, wherein an angle between the bottom surface of the stepped portion and an inner side surface of the stepped portion is an obtuse angle.

10. A semiconductor package comprising:
a substrate extending in a first direction and a second direction perpendicular to the first direction;
a first semiconductor chip disposed on the substrate, the first semiconductor chip having a stepped portion;
a lower chip stack disposed on the substrate and horizontally spaced apart from the first semiconductor chip in the first direction, the lower chip stack comprising a plurality of second semiconductor chips stacked in a third direction perpendicular to the first direction and the second direction;
a third semiconductor chip disposed on the lower chip stack and a bottom surface of the stepped portion, the third semiconductor chip overlapping with a portion of the first semiconductor chip in the third direction; and
an upper connecting portion electrically connecting the substrate to the third semiconductor chip,
wherein the upper connecting portion includes a bonding wire.

11. The semiconductor package of claim 10, further comprising:
an upper adhesive layer disposed between an uppermost second semiconductor chip of the second semiconductor chips and a bottom surface of the third semiconductor chip,
wherein the upper adhesive layer is in contact with the bottom surface of the stepped portion.

12. The semiconductor package of claim 10, further comprising:
a plurality of third upper semiconductor chips disposed on the third semiconductor chip and stacked in a cascade shape in the third direction,
wherein the third semiconductor chip is spaced apart from the first semiconductor chip in the first direction, and
wherein a top surface of an uppermost third upper semiconductor chip of the third upper semiconductor chips is located at a higher level in the third direction than a top surface of the first semiconductor chip.

13. The semiconductor package of claim 12, further comprising:
an upper adhesive layer disposed between a bottom surface of the uppermost third upper semiconductor chip and a top surface of the first semiconductor chip,
wherein the upper adhesive layer is in contact with the top surface of the first semiconductor chip.

14. The semiconductor package of claim 10, further comprising:
substrate pads disposed adjacent to a top surface of the substrate;
first chip pads disposed adjacent to a bottom surface of the first semiconductor chip; and
first connection terminals disposed between the substrate pads and the first chip pads.

15. The semiconductor package of claim 10, further comprising:
lower adhesive layers disposed between the second semiconductor chips; and
a lower connecting portion electrically connecting the second semiconductor chips to the substrate.

16. The semiconductor package of claim 10, wherein a top surface of the lower chip stack is located at the same level as the bottom surface of the stepped portion.

17. A semiconductor package comprising:
a substrate extending in a first direction and a second direction perpendicular to the first direction;
a first semiconductor chip disposed on the substrate, the first semiconductor chip having a stepped portion;
a lower chip stack disposed on the substrate and horizontally spaced apart from the first semiconductor chip in the first direction, the lower chip stack comprising a plurality of second semiconductor chips stacked in a third direction perpendicular to the first direction and the second direction;

an upper chip stack disposed on the lower chip stack, the upper chip stack comprising a plurality of third semiconductor chips stacked in a cascade shape in the third direction;

an upper connecting portion electrically connecting the substrate to the upper chip stack, the upper connecting portion including a bonding wire;

a lower connecting portion electrically connecting the substrate to the lower chip stack; and a molding layer covering the first semiconductor chip and the upper chip stack on the substrate, wherein a kind of the first semiconductor chip is different from a kind of the second semiconductor chip and a kind of the third semiconductor chip.

18. The semiconductor package of claim 17, further comprising:

an upper adhesive layer disposed between an uppermost second semiconductor chip of the second semiconductor chips and a lowermost third semiconductor chip of the third semiconductor chips, wherein the upper adhesive layer extends between the lowermost third semiconductor chip and a bottom surface of the stepped portion.

19. The semiconductor package of claim 17, wherein the first semiconductor chip includes a controller, wherein each of the second semiconductor chips includes a memory chip, and wherein each of the third semiconductor chips includes a memory chip of a different kind from that of the second semiconductor chips.

* * * * *